United States Patent
Sai et al.

(10) Patent No.: US 9,568,729 B2
(45) Date of Patent: Feb. 14, 2017

(54) OPTICAL APPARATUS, PROJECTION OPTICAL SYSTEM, EXPOSURE APPARATUS, AND METHOD OF MANUFACTURING ARTICLE

(71) Applicant: CANON KABUSHIKI KAISHA, Tokyo (JP)

(72) Inventors: Choshoku Sai, Utsunomiya (JP); Kohei Imoto, Saitama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 177 days.

(21) Appl. No.: 14/492,111

(22) Filed: Sep. 22, 2014

(65) Prior Publication Data

US 2015/0092172 A1 Apr. 2, 2015

(30) Foreign Application Priority Data

Sep. 30, 2013 (JP) ................................ 2013-205353

(51) Int. Cl.
*G03F 7/20* (2006.01)
*G02B 26/08* (2006.01)

(52) U.S. Cl.
CPC ....... *G02B 26/0858* (2013.01); *G02B 26/0825* (2013.01); *G03F 7/70266* (2013.01)

(58) Field of Classification Search
CPC . G02B 26/0825; G02B 26/0858; G02B 7/023; G02B 7/1827; G03F 7/70266; G03F 7/70725; G03F 7/70775; G03F 7/70825
See application file for complete search history.

(56) References Cited

U.S. PATENT DOCUMENTS

| | | | |
|---|---|---|---|
| 7,390,100 B2 | 6/2008 | Nagashima et al. |
| 7,710,626 B2 | 5/2010 | Ito |
| 7,907,326 B2 | 3/2011 | Uchida |
| 2004/0017623 A1 | 1/2004 | Watson |

(Continued)

FOREIGN PATENT DOCUMENTS

| | | | |
|---|---|---|---|
| CN | 1343897 A | 4/2002 |
| CN | 1885412 A | 12/2006 |

(Continued)

OTHER PUBLICATIONS

Office Action issued in TW103131920, mailed Oct. 15, 2015. English translation provided.

(Continued)

*Primary Examiner* — Toan Ton
*Assistant Examiner* — Michelle M Iacoletti
(74) *Attorney, Agent, or Firm* — Rossi, Kimms & McDowell LLP (57) ABSTRACT

The present invention provides an optical apparatus for deforming a reflecting surface of a mirror, comprising a base plate, a plurality of first actuators each configured to apply a force to the surface opposite to the reflecting surface, a plurality of second actuators each having rigidity lower than that of the first actuator, and configured to apply a force to the surface opposite to the reflecting surface, a sensor configured to detect information indicating a driving status of each of the plurality of first actuators, and a control unit configured to control, based on an output of the sensor, driving of each of the plurality of first actuators and driving of each of the plurality of second actuators so that a shape of the reflecting surface is changed to a target shape.

13 Claims, 7 Drawing Sheets

(56) References Cited

U.S. PATENT DOCUMENTS

| | | |
|---|---|---|
| 2004/0027632 A1 | 2/2004 | Watson |
| 2007/0286035 A1 | 12/2007 | Uchida |
| 2008/0259347 A1 | 10/2008 | Kurono |
| 2008/0291559 A1 | 11/2008 | Tanaka et al. |
| 2010/0167189 A1 | 7/2010 | Del Puerto |

FOREIGN PATENT DOCUMENTS

| | | |
|---|---|---|
| CN | 101122679 A | 2/2008 |
| CN | 101226274 A | 7/2008 |
| CN | 101504487 A | 8/2009 |
| CN | 201615788 U | 10/2010 |
| CN | 101923214 A | 12/2010 |
| CN | 202393061 U | 8/2012 |
| CN | 103207440 A | 7/2013 |
| JP | 2004064076 A | 2/2004 |
| JP | 2005004146 A | 1/2005 |
| TW | 200745651 A | 12/2007 |
| TW | 200807170 A | 2/2008 |
| WO | 2011074319 A1 | 6/2011 |

OTHER PUBLICATIONS

Office Action issued in Chinese Appln. No. 201410497939.3 mailed Jun. 3, 2016. English translation provided.

● : FIRST ACTUATOR
○ : SECOND ACTUATOR

OPTICAL APPARATUS, PROJECTION OPTICAL SYSTEM, EXPOSURE APPARATUS, AND METHOD OF MANUFACTURING ARTICLE

BACKGROUND OF THE INVENTION

Field of the Invention

The present invention relates to an optical apparatus for deforming the reflecting surface of a mirror, a projection optical system using the optical apparatus, an exposure apparatus, and a method of manufacturing an article.

Description of the Related Art

Since an astronomical telescope and an exposure apparatus used to manufacture a semiconductor device and the like are required to improve the resolution, it is necessary to accurately correct the optical aberration of an optical system used in these apparatuses. To achieve this, there are proposed optical apparatuses for correcting the optical aberration of an optical system by deforming the reflecting surface of a mirror included in the optical system (see patent literatures 1 and 2). Each of the optical apparatuses described in patent literatures 1 and 2 has a plurality of actuators each for applying a force to the rear surface (a surface opposite to the reflecting surface) of the mirror, and can correct the optical aberration of the optical system by controlling the driving of each actuator to deform the reflecting surface of the mirror.

If the mirror vibrates when the optical apparatus deforms the reflecting surface of the mirror, it may become difficult to accurately correct the optical aberration of the optical system. The optical apparatus is, therefore, required to support the mirror so that the eigen frequency of the mirror becomes high. In the optical apparatuses described in patent literatures 1 and 2, however, an actuator having low rigidity is used as each actuator for applying a force to the rear surface of the mirror, and the mirror can be supported at its peripheral portion by a supporting member. In the optical apparatuses described in patent literatures 1 and 2, therefore, it is difficult to support the mirror so that the eigen frequency of the mirror becomes high.

[Patent Literature 1] Japanese Patent Laid-Open No. 2005-4146

[Patent Literature 2] Japanese Patent Laid-Open No. 2004-64076

SUMMARY OF THE INVENTION

The present invention provides, for example, an optical apparatus advantageous in deforming the reflecting surface of a mirror.

According to one aspect of the present invention, there is provided an optical apparatus for deforming a reflecting surface of a mirror, comprising: a base plate; a plurality of first actuators each having a first terminal connected to a surface opposite to the reflecting surface of the mirror and a second terminal connected to the base plate, and configured to apply a force to the surface opposite to the reflecting surface by deforming so as to change a distance between the first terminal and the second terminal; a plurality of second actuators each having rigidity lower than that of the first actuator, arranged between the mirror and the base plate, and configured to apply a force to the surface opposite to the reflecting surface; a sensor configured to detect information indicating a driving status of each of the plurality of first actuators; and a control unit configured to control, based on an output of the sensor, driving of each of the plurality of first actuators and driving of each of the plurality of second actuators so that a shape of the reflecting surface is changed to a target shape.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

First Embodiment

Figure 1A:
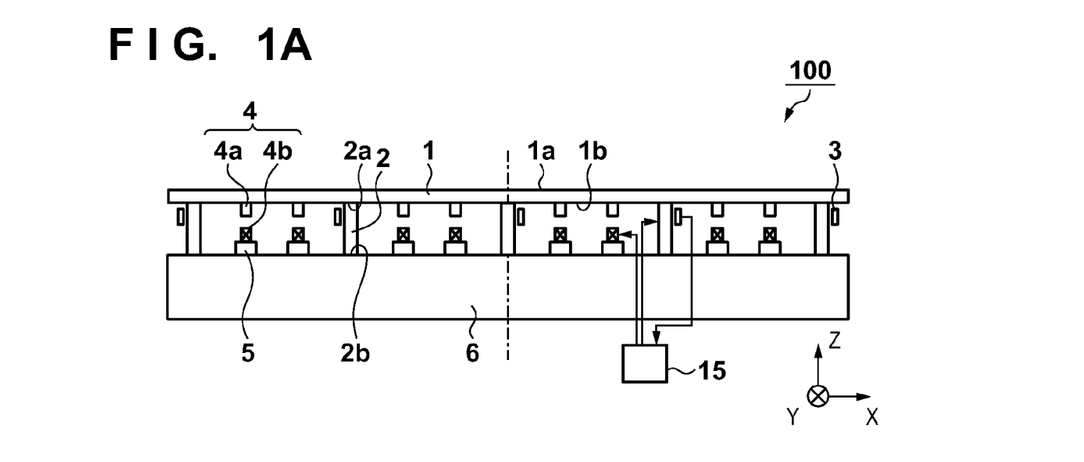
FIG. 1A is a sectional view showing an optical apparatus according to the first embodiment.

An optical apparatus 100 according to the first embodiment will be described with reference to FIG. 1A. FIG. 1A is a sectional view showing the optical apparatus 100 according to the first embodiment. The optical apparatus 100 of the first embodiment includes a mirror 1, a base plate 6, a plurality of first actuators 2, a plurality of second actuators 4, a plurality of displacement sensors 3, and a control unit 15. The control unit 15 includes a CPU and a memory, and controls the driving of each first actuator 2 and the driving of each second actuator 4.

The mirror 1 includes a reflecting surface 1a which reflects light and a rear surface 1b which is a surface opposite to the reflecting surface 1a. The mirror 1 is supported by the base plate 6 via the plurality of first actuators 2. The mirror 1 may be supported by the base plate 6 via at least three first actuators 2. Each first actuator 2 includes a first terminal 2a connected to the rear surface 1b of the mirror 1, and a second terminal 2b connected to the base plate 6. Each first actuator 2 can deform so as to change the distance between the first terminal 2a and the second terminal 2b, thereby applying a force to a position on the rear surface 1b where the first terminal 2a is connected. An actuator having high rigidity such as a piezo actuator, magnetostriction element, or electric lead screw is used as the first actuator 2. Referring to FIG. 1A, the first terminals 2a of the first actuators 2 are directly connected to the rear surface 1b of the mirror 1, and the second terminals 2b of the first actuators 2 are directly connected to the base plate 6. The present invention, however, is not limited to this. For example, the first terminals 2a of the first actuators 2 may be connected to the rear surface 1b of the mirror 1 via an elastic member or rigid body, and the second terminals 2b of the first actuators 2 may be connected to the base plate 6 via an elastic member or rigid body.

Since the optical apparatus 100 includes the plurality of first actuators 2, it is difficult to match the lengths of all the first actuators to a predetermined value when assembling the optical apparatus 100. Therefore, the mirror 1 may be distorted at the time of assembling. To assemble the optical apparatus 100 while maintaining satisfactory shape accuracy of the mirror 1, it is necessary to absorb an error in length of each first actuator 2. Furthermore, the mirror 1 is driven to be deformed, and thus has low rigidity and is readily deformed by an external force. It is, therefore, impossible to use a general thread fastening method at the time of assembling because this method applies an external force to the mirror 1, thereby disabling the satisfactory shape accuracy from being maintained.

Figure 9:
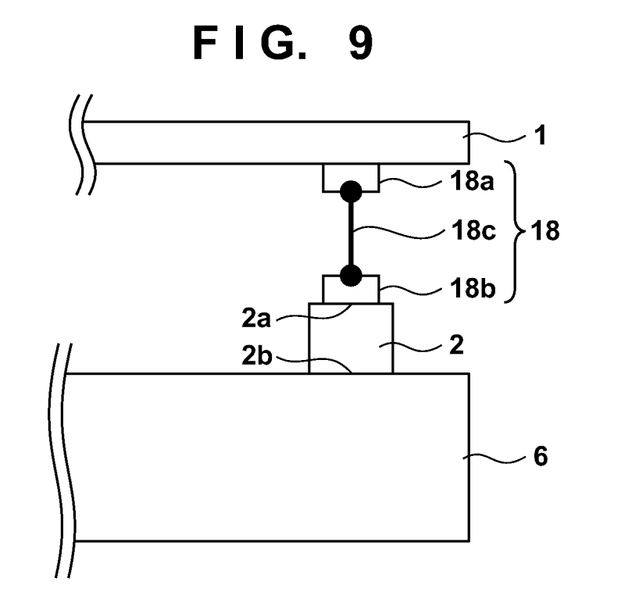
FIG. 9 is a view showing a case in which a first actuator and a mirror are connected using a coupling mechanism.

As shown in FIG. 9, a coupling mechanism 18 can connect the mirror 1 and the first actuators 2 by absorbing an error in length of each first actuator 2. The coupling mechanism 18 can perform adjustment according to an error in length of each first actuator 2 (an error in distance between the first terminal 2a and second terminal 2b).

Figure 10:
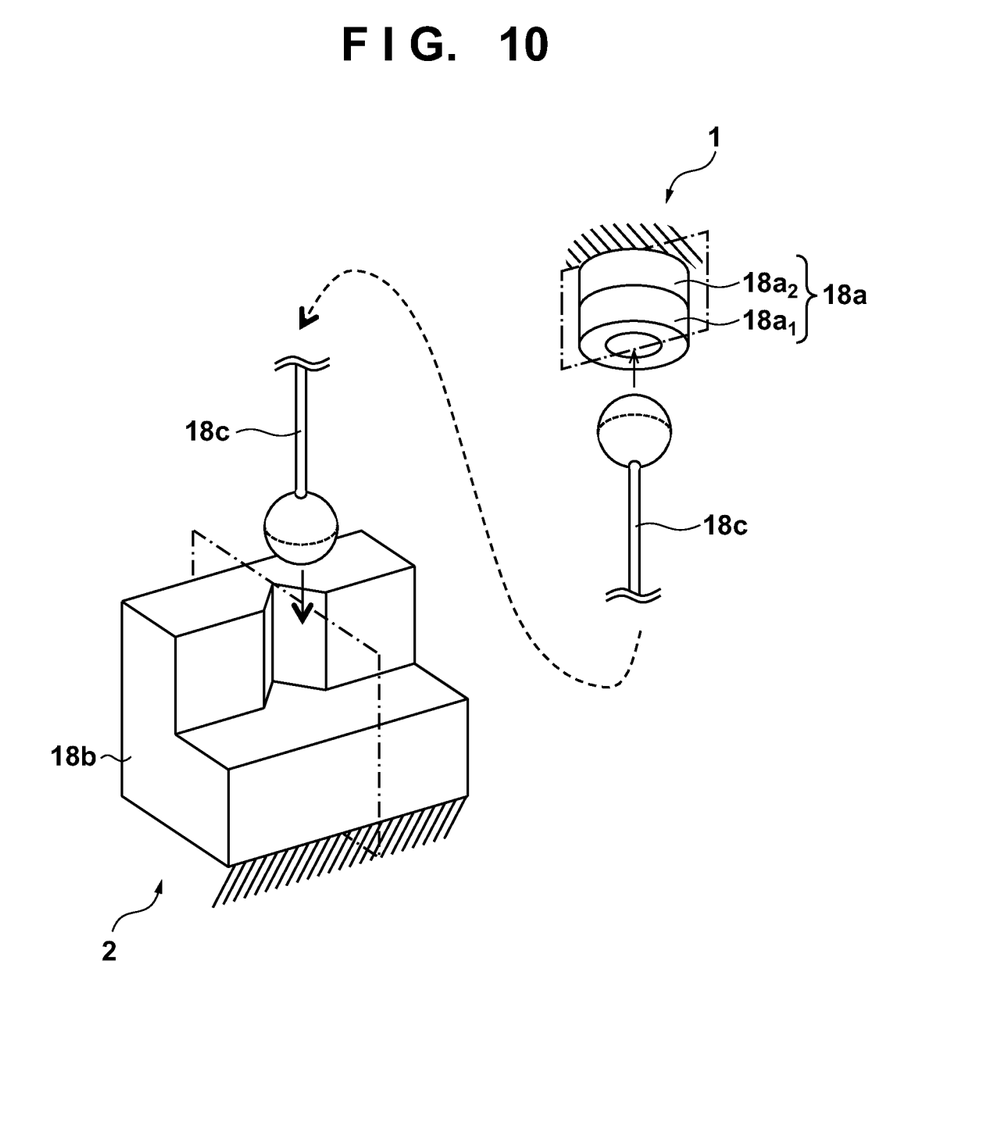
FIG. 10 is a view for explaining the coupling mechanism.

The coupling mechanism 18 will be described with reference to FIG. 10. The coupling mechanism 18 includes a cone portion 18a, a V-groove portion 18b, and a ball end rod 18c. The cone portion 18a is formed from a magnet portion $18a_2$ and a nonmagnetic cone portion $18a_1$ made of a nonmagnetic material in which a conical recess (to be referred to as a "cone" hereinafter) is formed. A V-shaped groove is formed in the V-groove portion 18b in the vertical direction. The cone portion 18a is connected to the mirror 1, and the V-groove portion 18b is connected to the first actuator 2. The ball on the side of the cone portion 18a of the ball end rod 18c is made of a magnetic material.

Figure 11A:
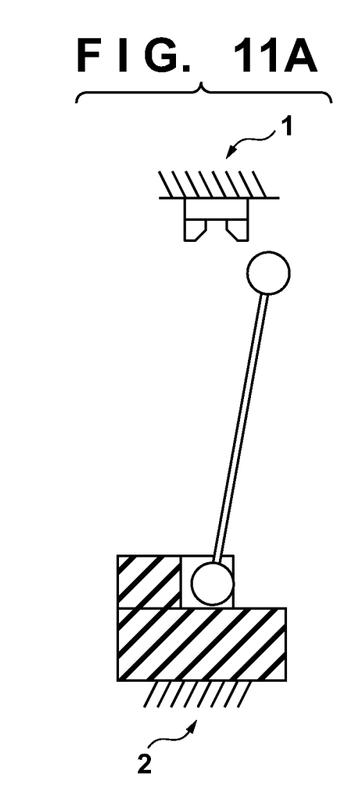
FIG. 11A is a sectional view for explaining assembling of the optical apparatus using the coupling mechanism.
Figure 11B:
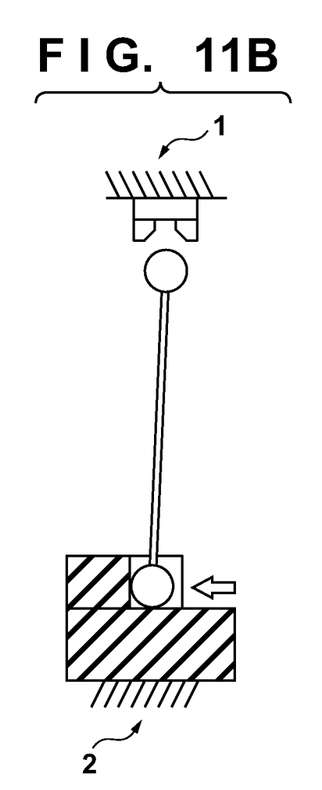
FIG. 11B is a sectional view for explaining assembling of the optical apparatus using the coupling mechanism.
Figure 11C:
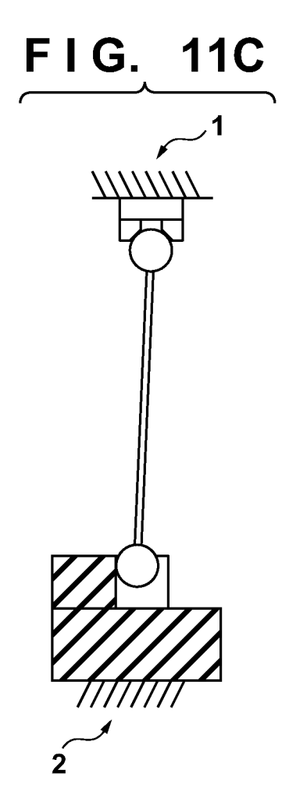
FIG. 11C is a sectional view for explaining assembling of the optical apparatus using the coupling mechanism.

Assembling of the optical apparatus 100 using the coupling mechanism 18 will be explained with reference to FIGS. 11A to 11D. FIGS. 11A to 11D are sectional views each showing a surface indicated by one-dot dashed lines in FIG. 10. The cone portion 18a is attached to the side of the mirror 1, and the V-groove portion 18b is attached to the first actuator 2. As shown in FIG. 11A, one ball of the ball end rod 18c is made in contact along the V-groove of the V-groove portion 18b. As shown in FIG. 11B, the ball is made in light contact with the V-groove. As shown in FIG. 11C, while keeping the ball in light contact with the V-groove, the other ball is inserted to the cone of the cone portion 18a. At this time, the ball is attracted by the magnetic force of the magnet portion $18a_2$ of the cone portion 18a. It is, therefore, unnecessary to apply a force to insert the ball to the cone portion 18a, thereby minimizing a change of the mirror due to application of the force to insert the ball. Thanks to the conical shape of the nonmagnetic cone portion $18a_1$, the magnetic ball can be smoothly inserted until it is brought into line contact with the cone. If it is impossible to reduce friction between the cone portion 18a and the ball, it is possible to facilitate smooth insertion of the ball by providing a friction reduction method such as DLC (Diamond-Like Carbon) to the surface of the cone or ball.

Figure 11D:
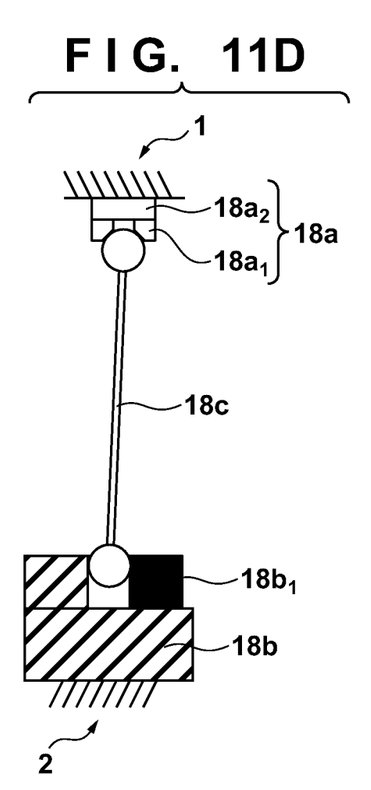
FIG. 11D is a sectional view for explaining assembling of the optical apparatus using the coupling mechanism.

With the above process, the ball on the side of the mirror 1 is constrained. The ball on the side of the base plate 6 will be constrained next. Referring to FIG. 11C, the ball only contacts the V-groove. Therefore, as shown in FIG. 11D, a constraining portion $18b_1$ is used to press and constrain the ball against the V-groove portion 18b. Even if the cone portion 18a and the V-groove portion 18b are not on one straight line (Z-axis) as shown in FIG. 11D, the ball end rod 18c can connect the mirror 1 and the first actuator 2. Regardless of the interval between the mirror 1 and the first actuators 2, they can be connected at an arbitrary interval. Since no unnecessary force to deform the mirror 1 is applied at the time of connection, it is possible to minimize the deformation of the mirror 1 at the time of assembling the optical apparatus 100.

Similarly to the above-described elastic member, the coupling mechanism 18 may be arranged on the side of the mirror 1 or base plate 6 with respect to the first actuator 2. The elastic member may be provided in the rod portion of the ball end rod 18c. Furthermore, to improve the stability of the coupling mechanism 18, the ball and the cone portion 18a or the ball and the V-groove portion 18b may be adhered and fixed after assembling.

Each of the plurality of displacement sensors 3 is provided near the corresponding one of the first actuators 2, and detects a displacement between the first terminal 2a and second terminal 2b of the first actuator 2 to perform feedback control of the first actuator 2. The displacement between the first terminal 2a and second terminal 2b of the first actuator 2 will be referred to as a "driving displacement" hereinafter. If, for example, a piezo actuator is used as the first actuator 2, hysteresis occurs in the piezo actuator, and thus it may be impossible to obtain a displacement corresponding to a command value (voltage) to the piezo actuator. It is, therefore, necessary to provide, in the optical apparatus 100, a sensor for detecting information indicating the driving status of each of the plurality of first actuators 2. In the first embodiment, the displacement sensor 3 is used as the sensor, and detects the driving displacement of the first actuator 2 as information indicating the driving status. When the piezo actuator is used as the first actuator 2, the driving displacement of the first actuator 2 is detected by the displacement sensor 3, and feedback control is performed by a command value based on the difference between the detected driving displacement (the output of the displacement sensor 3) and a target displacement.

Figure 2:
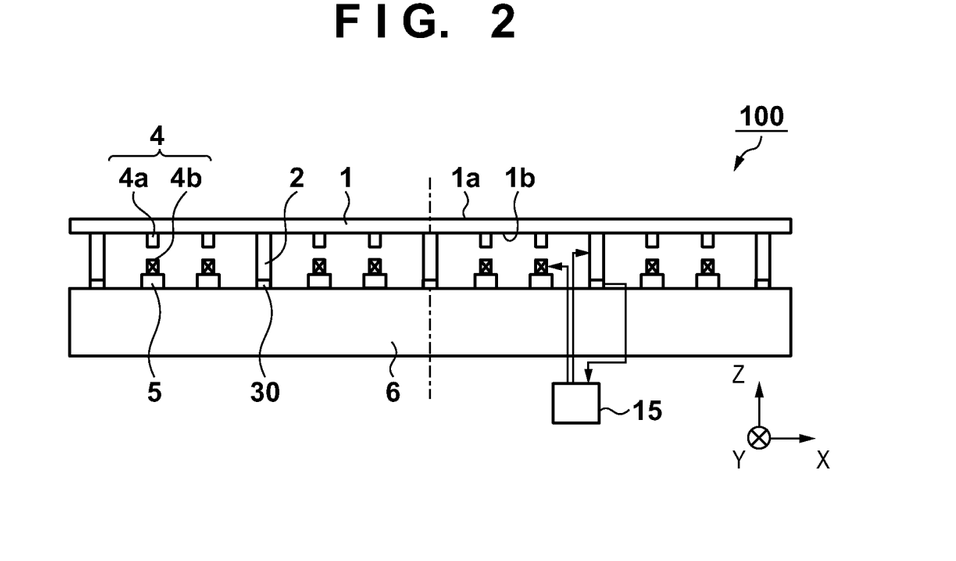
FIG. 2 is a sectional view showing the optical apparatus according to the first embodiment.

In the optical apparatus 100 of the first embodiment, the displacement sensors 3 are provided near the respective first actuators 2. However, for example, force sensors 30 each for detecting the driving force of the first actuator 2 may be provided instead of the displacement sensors 3. FIG. 2 is a sectional view showing the optical apparatus 100 when the force sensors 30 are used. Each force sensor 30 is arranged, for example, between the first actuator 2 and the base plate 6, and can detect a force applied by the first actuators 2 to the rear surface 1b of the mirror 1, that is, the driving force of the first actuators 2.

Figure 3:
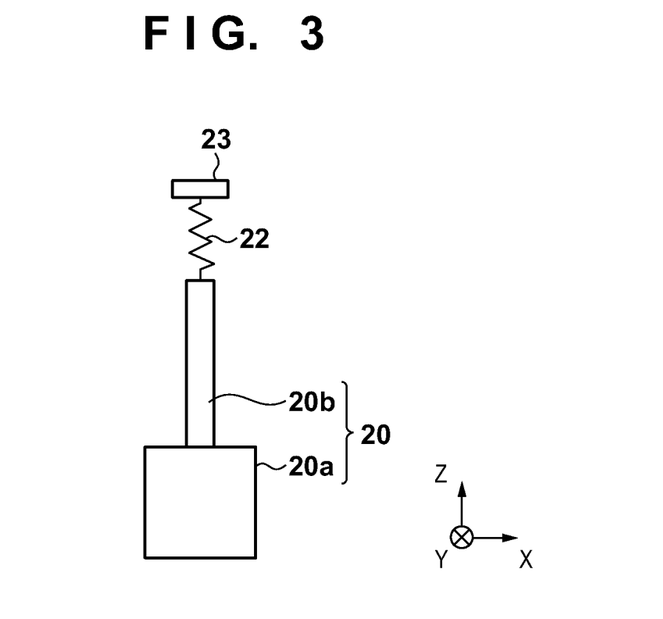
FIG. 3 is a view showing an example of a second actuator.

Each of the plurality of second actuators 4 is arranged between the mirror 1 and the base plate 6, and an actuator having rigidity lower than that of the first actuator 2 is used. A non-contact type actuator (for example, a linear motor, electromagnet, or electrostatic actuator) including a movable element 4a and stator 4b which do not contact each other is used as the second actuator 4. In the first embodiment, the stator 4b is fixed to the base plate 6 via a member 5, and the movable element 4a is fixed to the rear surface 1b of the mirror 1. This enables each second actuator 4 to change the distance between the mirror 1 and the base plate 6 by applying a force to the rear surface 1b of the mirror 1. Unlike the first actuator 2, each second actuator 4 includes no sensor for detecting the displacement of the second actuator 4. This is because hysteresis is difficult to occur in the second actuator 4, and it is possible to obtain a displacement corresponding to a command value (current or voltage) to the second actuator 4. That is, it is not necessary to perform feedback control of the second actuator 4 using the detection result (output) of the sensor. As shown in FIG. 3, each second actuator 4 may be configured to include an elastic member 22 and an actuator 20 which are series-connected. For example, the actuator 20 series-connected to the elastic member 22 includes an electromagnetic motor 20a and a screw 20b. In this case, the movable element includes the screw 20b, the elastic member 22 and a coupling pad 23. The stator includes the electromagnetic motor 20a. The actuator 20 drives the screw 20b in the vertical direction by supplying a signal to the electromagnetic motor 20a by the control unit 15. For example, a coil spring is used as the elastic member 22, and has one end connected to the end of the screw 20b and the other end connected to the rear surface 1b of the mirror 1 via the coupling pad 23.

Figure 1B:
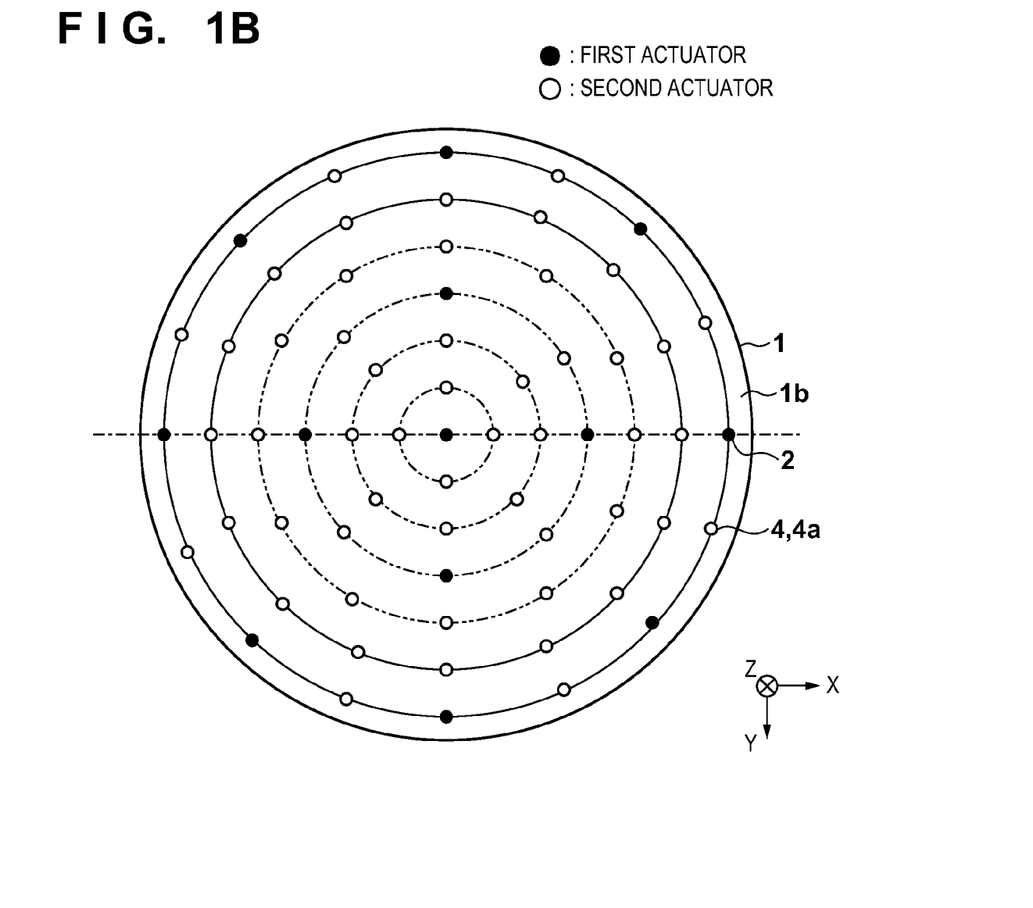
FIG. 1B is a view showing the optical apparatus according to the first embodiment.

FIG. 1B is a view showing an example of the arrangement of the plurality of actuators in the optical apparatus 100 according to the first embodiment. Referring to FIG. 1B, solid circles respectively indicate the first actuators 2, and open circles respectively indicate the second actuators 4. The plurality of first actuators 2, for example, equally share the mass of the mirror 1, and may be arranged so that the lowest order eigen frequency of the optical apparatus 100 becomes equal to or higher than a desired frequency. Furthermore, as shown in FIG. 1B, the plurality of first actuators 2 are arranged apart from each other so that at least one second actuator 4 is arranged between the adjacent first actuators 2. By arranging the plurality of second actuators 4, as described above, it is possible to widen the interval between the adjacent first actuators 2.

In the optical apparatus 100 having the above arrangement, to control the shape of the reflecting surface 1a of the mirror 1, a compliance matrix for driving the plurality of first actuators 2 and the plurality of second actuators 4 is necessary. The compliance matrix includes conversion factors for converting a force (current or voltage) applied to the rear surface 1b of the mirror 1 into the displacement amount of the reflecting surface 1a. A method of generating a compliance matrix in the optical apparatus 100 using the plurality of first actuators 2 and the plurality of second actuators 4 as shown in FIG. 1B will be described. In generation of a compliance matrix, M represents the sum of the number of first actuators 2 and that of second actuators 4, and N represents the number of points where the deformation (displacement amount) of the reflecting surface 1a of the mirror 1 is measured.

Figure 4:
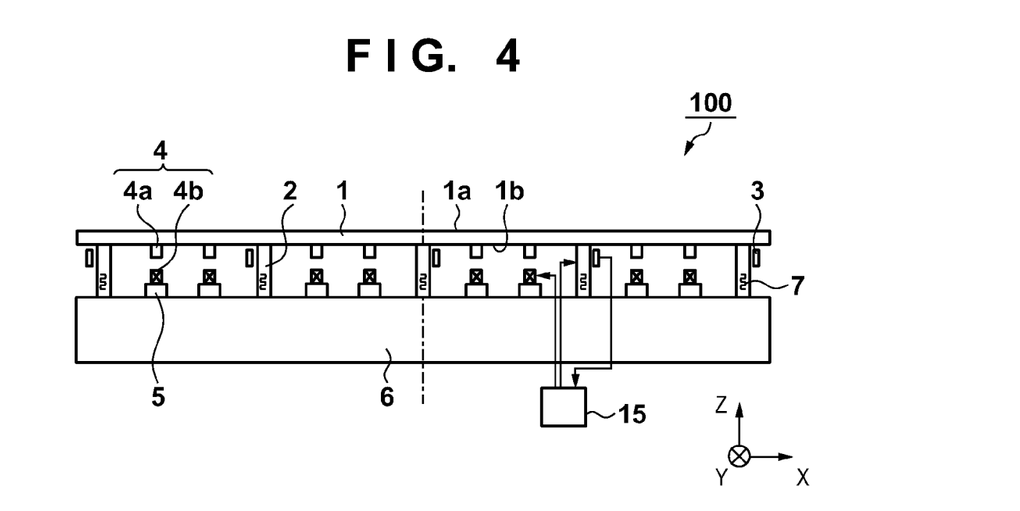
FIG. 4 is a sectional view showing the arrangement of the optical apparatus when a compliance matrix is generated.

FIG. 4 is a sectional view showing the arrangement of the optical apparatus 100 when generating a compliance matrix. To generate a compliance matrix, it is necessary to detect the driving voltage or driving force of each first actuator 2. It is possible to readily acquire the driving voltage from a command value. If, however, it is desirable to acquire the driving force, it is only necessary to provide a strain gauge 7 on the side surface of each first actuator 2, as shown in FIG. 4, and detect the driving force of the first actuator 2 by the strain gauge 7.

The control unit 15 sequentially drives all the actuators including the plurality of first actuators 2 and the plurality of second actuators 4 one by one. When driving the actuators one by one, the control unit 15 acquires the driving voltage of each first actuator 2 or the driving force of each first actuator 2 detected by the strain gauge 7, and the driving force (converted from the command value) of each second actuator 4. When driving the actuators one by one, the control unit 15 also acquires information indicating the deformation of the reflecting surface 1a of the mirror 1. The control unit 15 can then generate a compliance matrix based on the driving voltage or driving force of each first actuator 2, the driving force of each second actuator 4, and the information indicating the deformation of the reflecting surface 1a of the mirror 1. A measurement unit (not shown) for measuring the shape of the reflecting surface 1a of the mirror 1 may be provided in the optical apparatus 100 to acquire the information indicating the deformation of the reflecting surface 1a of the mirror 1.

Let M be the sum of the number of first actuators 2 and the number of second actuators 4, which are arranged on the rear surface 1b of the mirror 1, and N be the number of calculation points or measurement points on the reflecting surface 1a of the mirror 1. For the sake of descriptive convenience, a command value for generating a driving voltage or driving force in each first actuator 2 and a driving force in each second actuator 4 is defined as a "drive command value", and represented by $F_j$ (j=1, ..., M). When the drive command value $F_j$ is supplied to an actuator at a position j on the rear surface 1b of the mirror 1, a displacement amount $z_{ij}$ generated at an arbitrary point $P(X_i, Y_i)$ on the reflecting surface 1a of the mirror 1 is given by:

$$z_{ij} = \frac{F_j}{K_{ij}} = C_{ij} F_j \quad (1)$$

where $K_{ij}$ represents a spring constant between the point $(X_i, Y_i)$ and the position j on which the actuator acts, and $C_{ij}$ is called compliance, and is the reciprocal of the spring constant $K_{ij}$, as given by:

$$C_{ij} = \frac{1}{K_{ij}} \quad (2)$$

Based on equation (1), the compliance $C_{ij}$ at the point $P(X_i, Y_i)$ when driving the actuator at the position j is given by:

$$C_{ij} = \frac{z_{ij}}{F_j} \quad (3)$$

As described above, the compliance $C_{ij}$ at the point $P(X_i, Y_i)$ when driving the actuator at the position j is obtained at all the points (i=1 to N) where the displacement amount of the reflecting surface 1a of the mirror 1 is measured. With this operation, a compliance vector C when driving the actuator at the position j can be given by:

$$C_j = [C_{1j} \ldots C_{ij} \ldots C_{Nj}]^T \quad (4)$$

Furthermore, by obtaining the compliance vector $C_j$ when driving each actuator, it is possible to obtain a compliance matrix given by:

$$C = \begin{bmatrix} C_{11} & C_{12} & \ldots & C_{1j} & \ldots & C_{1(M-1)} & C_{1M} \\ C_{21} & C_{22} & \ldots & C_{2j} & \ldots & C_{2(M-1)} & C_{2M} \\ \vdots & \vdots & & \vdots & & \vdots & \vdots \\ C_{i1} & C_{i2} & \ldots & C_{ij} & \ldots & C_{i(M-1)} & C_{iM} \\ \vdots & \vdots & & \vdots & & \vdots & \vdots \\ C_{(N-1)1} & C_{(N-1)2} & \ldots & C_{(N-1)j} & \ldots & C_{(N-1)(M-1)} & C_{(N-1)M} \\ C_{N1} & C_{N2} & \ldots & C_{Nj} & \ldots & C_{N(M-1)} & C_{NM} \end{bmatrix}_{N \times M} \quad (5)$$

As described above, the control unit 15 can sequentially drive the actuators, and generate a compliance matrix C given by equation (5) based on the drive command value of each actuator at the time of driving, and information indicating the deformation of the reflecting surface 1a of the mirror 1. When generating the compliance matrix C, the control unit 15 can provide a command value to each actuator so that the drive command value of the actuator becomes a unit drive command value, that is, a constant drive command value in the plurality of actuators. By setting the drive command value of each actuator as a unit drive command value, it becomes easy to generate the compliance matrix C. Upon completion of generation of the compliance matrix C, the strain gauges 7 used to generate the compliance matrix C may be removed, or may be left intact and used to calibrate the compliance matrix C. If, as shown in FIG. 2, the force sensors 30 each for detecting the driving force of the first actuator 2 are provided in the optical apparatus 100, it is unnecessary to use the strain gauges 7 to generate the compliance matrix.

The relationship between the displacement amount of the reflecting surface 1a of the mirror 1 and the drive command value of the actuator is given by:

$$Z = CF \quad (6)$$

where Z represents the vector of the displacement amount of the reflecting surface 1a of the mirror 1, and F represents the vector of the drive command value of the actuator. The vectors Z and F are respectively given by:

$$Z = [Z_1 \ldots Z_i \ldots Z_N]^T$$

$$F = [F_1 \ldots F_j \ldots F_M]^T \quad (7)$$

The control unit 15 determines the drive command value of each first actuator 2 and that of each second actuator 4 based on the generated compliance matrix C so that the shape of the reflecting surface 1a of the mirror 1 is changed to a target shape $Z_{obj}$. At this time, there are some methods of determining the drive command value of each first actuator 2 and that of each second actuator 4 based on the generated compliance matrix C. As described above, for example, when the generated compliance matrix C is a non-square matrix of N×M, there is a method of determining the drive command value of each actuator using singular value decomposition as one method. There is provided another method of determining the drive command value of each actuator by generating a compliance matrix C' (a square matrix of M×M) for only a position where the actuator applies a force. As still another method, there is provided an optimization method of determining the drive command value of each actuator using a genetic algorithm so that the difference between the target shape $Z_{obj}$ and the shape of the reflecting surface of the mirror is minimized. These methods are well known and a description thereof will be omitted.

The control unit 15 controls the driving of each first actuator 2 and that of the second actuator 4 based on the determined drive command value of each actuator, and deforms the reflecting surface 1a of the mirror 1. Assume, for example, that piezo actuators using PZT (Lead Zirconate Titanate) having a Young's modulus of about 90 GPa are used as the first actuators 2, and linear actuators are used as the second actuators 4. In this case, each piezo actuator has a high Young's modulus, and thus has high rigidity. On the other hand, the rigidity of each linear actuator is almost zero since the movable element and stator are magnetically coupled. In this case, the control unit 15 applies, as a command value, a voltage corresponding to the determined drive command value to each piezo actuator serving as the first actuator 2. The control unit 15 supplies, as a command value, a current corresponding to the determined drive command value to each linear actuator serving as the second actuator 4. As described above, hysteresis occurs in the piezo actuator at this time, and thus it may be impossible to obtain a target displacement amount even by applying, as a command value, the voltage corresponding to the determined drive command value, that is, it may be impossible to obtain a displacement corresponding to the command value (voltage) to the piezo actuator. The control unit 15, therefore, detects the displacement of the piezo actuator by the displacement sensor 3, and performs feedback control of the piezo actuator so that the difference between the detected displacement amount (the output of the displacement sensor 3) and the target displacement amount falls within a tolerance range.

As described above, the plurality of first actuators 2 and the plurality of second actuators 4 each having rigidity lower than that of the first actuator 2 are arranged between the mirror 1 and the base plate 6 in the optical apparatus 100 of the first embodiment. The mirror 1 is supported by the base plate 6 via the plurality of first actuators 2. This enables the optical apparatus 100 of the first embodiment to support the mirror 1 by the plurality of first actuators 2, thereby increasing the eigen frequency of the mirror. It is, therefore, possible to reduce the influence of a vibration occurring when deforming the reflecting surface 1a of the mirror 1, and accurately deform the reflecting surface 1a of the mirror 1 at high speed.

If the target shape of the reflecting surface 1a of the mirror 1 is asymmetrical, changing the reflecting surface 1a of the mirror 1 by the plurality of actuators tilting the mirror 1, resulting in a change in attitude of the mirror 1. Also, when the temperature of an environment where the optical apparatus 100 is arranged varies, the attitude of the mirror 1 may change. As the attitude of the mirror 1 changes as described above, the optical performance of the optical apparatus 100 may degrade. The control unit 15 of the optical apparatus 100 of the first embodiment can control the attitude of the mirror 1 using at least three of the plurality of first actuators 2 based on the detection results of the displacement sensors 3 (force sensors 30) provided for the respective first actuators 2. Since the detection result of each displacement sensor 3 (each force sensor 30) generally includes both pieces of information about the surface deformation and rigid body displacement of the mirror 1, these pieces of information need to be separated. As one method of separating the pieces of information about the surface deformation and the rigid body displacement, a value obtained by subtracting a target displacement amount necessary for deformation of the reflecting surface 1a of the mirror 1 from the detection result is set as the rigid body displacement of the mirror.

Second Embodiment

Figure 5:
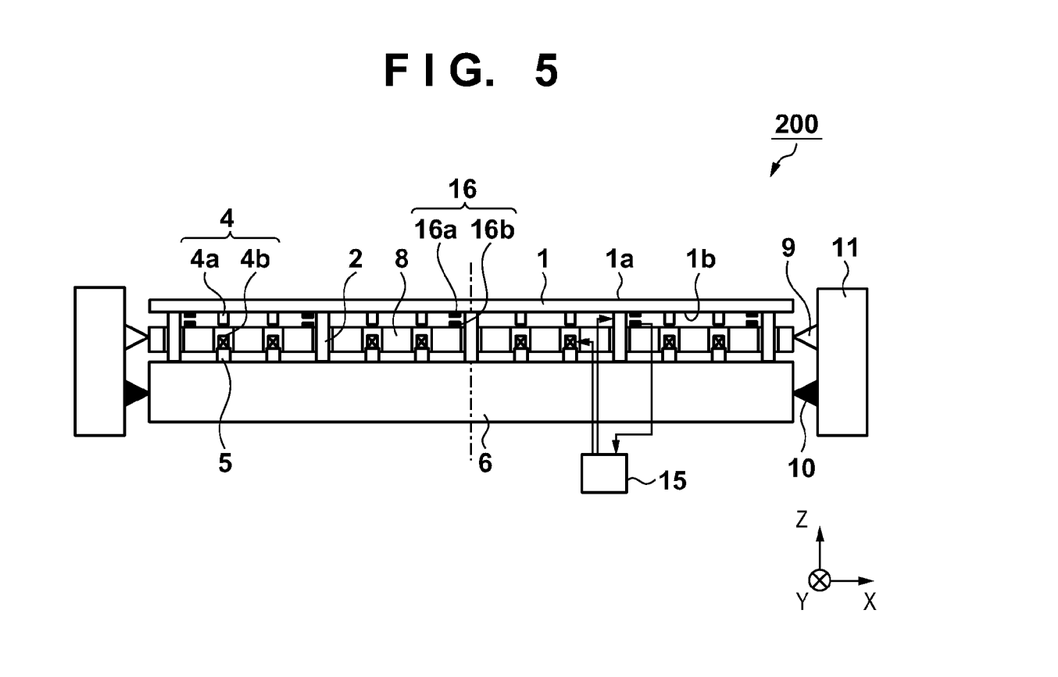
FIG. 5 is a sectional view showing an optical apparatus according to the second embodiment.

An optical apparatus 200 according to the second embodiment will be described with reference to FIG. 5. FIG. 5 is a sectional view showing the optical apparatus 200 according to the second embodiment. When compared to the optical apparatus 100 of the first embodiment, the optical apparatus 200 of the second embodiment includes a reference plate 8 and a structure 11, and the reference plate 8 and a base plate 6 are respectively supported by the structure 11 via kinematic mounts 9 and 10. The optical apparatus 200 of the second embodiment includes detection units 16 each for detecting the distance between the reference plate 8 and a rear surface 1b of a mirror 1 as sensors each for detecting information indicating the driving status of a corresponding first actuator 2. Each detection unit 16 can include a sensor target 16a fixed to the rear surface 1b of the mirror 1, and a sensor probe 16b fixed to the reference plate 8. The sensor target 16a may be provided on the entire rear surface 1b of the mirror 1 so as to be the common target of the plurality of sensor probes 16b. If, for example, the detection unit 16 is a capacitance type displacement sensor, a conductive film may be formed as the sensor target 16a on the entire rear surface 1b of the mirror 1.

Figure 6:
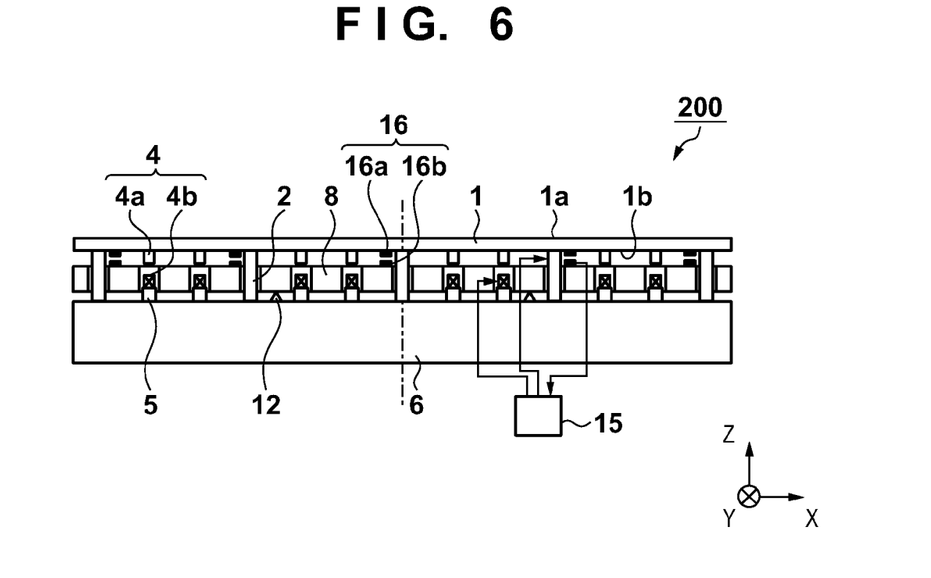
FIG. 6 is a sectional view showing the optical apparatus according to the second embodiment.

If the first actuators 2 and second actuators 4 are driven, their reaction forces deform not only the mirror 1 but also the base plate 6. As a result, if the distance between the base plate 6 and the mirror 1 is detected, and the first actuators 2 and second actuators 4 are controlled based on the detection result, an error undesirably occurs in deformation of a reflecting surface 1a of the mirror 1. To solve this problem, the reference plate 8 is provided in the optical apparatus 200 of the second embodiment, and each detection unit 16 detects the distance between the reference plate 8 and the mirror 1. In the optical apparatus 200 having the above arrangement, a control unit 15 controls the first actuators 2 and second actuators 4 based on the detection results of the detection units 16 so that the shape of the reflecting surface 1a of the mirror 1 is changed to a target shape. This allows the optical apparatus 200 of the second embodiment to accurately deform the reflecting surface 1a of the mirror 1 at high speed. As shown in FIG. 6, the reference plate 8 may be supported by the base plate 6 via a kinematic mount 12, instead of the structure 11.

Third Embodiment

Figure 7:
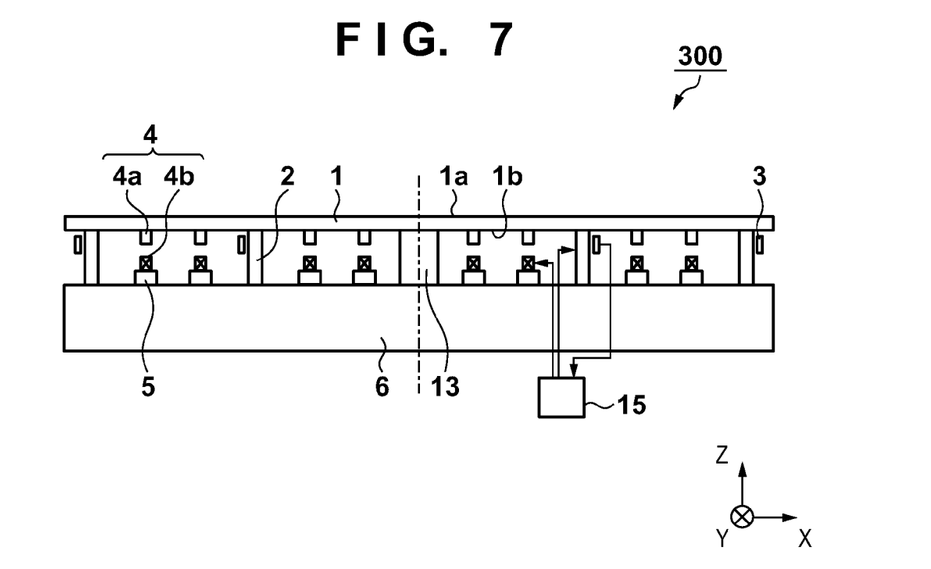
FIG. 7 is a sectional view showing an optical apparatus according to the third embodiment.

An optical apparatus 300 according to the third embodiment will be described with reference to FIG. 7. FIG. 7 is a sectional view showing the optical apparatus 300 according to the third embodiment. When compared to the optical apparatus 100 of the first embodiment, in the optical apparatus 300 of the third embodiment, part (for example, the central portion) of a mirror 1 is fixed to a base plate 6 via a fixing member 13. If no light is emitted to the central portion of the mirror 1 used for an exposure apparatus or astronomical telescope, it is not necessary to deform a reflecting surface 1a in the central portion of the mirror 1. In this case, it is possible to fix the central portion of the mirror 1 to the base plate 6 via the fixing member 13, and decrease the number of first actuators 2, as compared with the optical apparatus 100 of the first embodiment.

<Embodiment of Exposure Apparatus>

An exposure apparatus according to an embodiment will be described with reference to FIG. 8. An exposure apparatus 50 according to this embodiment can include an illumination optical system IL, a projection optical system PO, a mask stage MS capable of moving while holding a mask 55, and a substrate stage WS capable of moving while holding a substrate 56. The exposure apparatus 50 can also include a control unit 51 for controlling processing of exposing the substrate 56.

A circular exposure region which is long in the Y direction can be formed on the mask 55 by light emitted by a light source (not shown) included in the illumination optical system IL through a slit (not shown) included in the illumination optical system IL. The mask 55 and the substrate 56 are held by the mask stage MS and the substrate stage WS, respectively, and arranged at optically almost conjugate positions via the projection optical system PO (at the positions of the object plane and image plane of the projection optical system PO). The projection optical system PO has a predetermined projection magnification (for example, ½), and projects the pattern formed on the mask 55 onto the substrate 56. The mask stage MS and the substrate stage WS are scanned at a speed ratio corresponding to the projection magnification of the projection optical system PO in a direction (for example, the X direction) parallel to the object plane of the projection optical system PO. This makes it possible to transfer the pattern formed on the mask 55 to the substrate 56.

Figure 8:
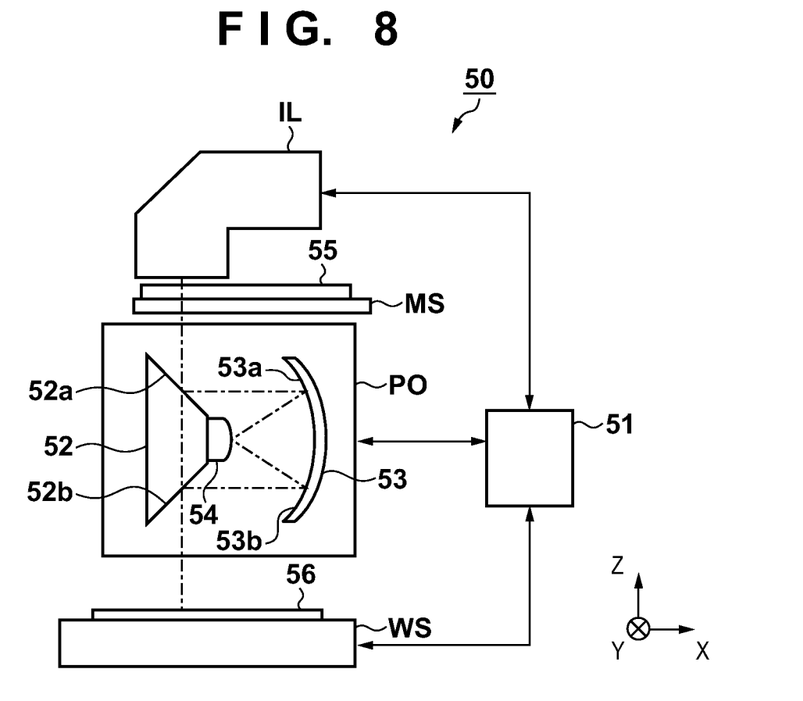
FIG. 8 is a view showing an exposure apparatus.

The projection optical system PO can be configured to include, for example, a plane mirror 52, a concave mirror 53, and a convex mirror 54, as shown in FIG. 8. Exposure light emitted by the illumination optical system IL and transmitted through the mask 55 has an optical path deflected by a first surface 52a of the plane mirror 52, and enters a first surface 53a of the concave mirror 53. The exposure light reflected by the first surface 53a of the concave mirror 53 is then reflected by the convex mirror 54, thereby entering a second surface 53b of the concave mirror 53. The exposure light reflected by the second surface 53b of the concave mirror 53 has an optical path deflected by a second surface 52b of the plane mirror 52, and forms an image on the substrate 56. In the projection optical system PO having the above arrangement, the surface of the convex mirror 54 serves as an optical pupil. In the above-described arrangement of the exposure apparatus 50, one of the optical apparatuses of the first to third embodiments can be used as, for example, an apparatus for deforming the reflecting surface of the concave mirror 53 serving as the mirror 1. By using one of the optical apparatuses of the first to third embodiments for the exposure apparatus 50, it is possible to deform the reflecting surface (the first surface 53a and second surface 53b) of the concave mirror 53, thereby accurately correcting the optical aberration of the projection optical system PO. The control unit 51 of the exposure apparatus 50 may be configured to include a control unit 15 for controlling the actuators in the optical apparatus.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of forming a latent image pattern on a photosensitive agent applied on a substrate by using the above-described exposure apparatus (a step of exposing the substrate), and a step of developing the substrate on which the latent image pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-205353 filed on Sep. 30, 2013, which is hereby incorporated by reference herein in its entirety.

What is claimed is:

1. An optical apparatus for deforming a reflecting surface of a mirror, comprising:
 a base plate;
 a plurality of first actuators each having a first terminal connected to a surface opposite to the reflecting surface of the mirror and a second terminal connected to the base plate, and configured to apply a force to the surface opposite to the reflecting surface by deforming so as to change a distance between the first terminal and the second terminal;
 a plurality of second actuators each having rigidity lower than that of the first actuators, arranged between the mirror and the base plate, and configured to apply a force to the surface opposite to the reflecting surface;
 a sensor configured to detect information indicating a driving status of each of the plurality of first actuators; and
 a control unit configured to control, based on an output of the sensor, driving of each of the plurality of first actuators and driving of each of the plurality of second actuators so that a shape of the reflecting surface is changed to a target shape.

2. The apparatus according to claim 1, wherein the plurality of first actuators are arranged apart from each other so that at least one of the plurality of second actuators is arranged between adjacent first actuators.

3. The apparatus according to claim 1, further comprising a fixing member configured to fix part of the mirror to the base plate.

4. The apparatus according to claim 1, wherein each of the plurality of second actuators includes a stator and a movable element, which do not contact each other, and
 one of the stator and the movable element is fixed to the mirror, and the other is fixed to the base plate.

5. The apparatus according to claim 1, wherein each of the plurality of second actuators is configured to drive a movable element which includes an elastic member connecting to the mirror.

6. The apparatus according to claim 1, wherein the sensor includes a displacement sensor configured to detect, as the information indicating the driving status, a displacement between the first terminal and the second terminal of each of the plurality of first actuators.

7. The apparatus according to claim 1, wherein the sensor includes a force sensor configured to detect, as the information indicating the driving status, the force applied by each of the plurality of first actuators to the surface opposite to the reflecting surface.

8. The apparatus according to claim 1, further comprising a reference plate arranged between the mirror and the base plate,
 wherein the sensor detects a distance between the reference plate and the mirror as the information indicating the driving status.

9. The apparatus according to claim 1, wherein the control unit includes a compliance matrix for converting the force applied to the surface opposite to the reflecting surface into a displacement amount of the reflecting surface, and determines a drive command value of each of the plurality of first actuators and a drive command value of each of the plurality of second actuators based on the compliance matrix so that the reflecting surface is changed to the target shape.

10. The apparatus according to claim 9, wherein the control unit generates the compliance matrix based on the shape of the reflecting surface when sequentially driving a plurality of actuators including the plurality of first actuators and the plurality of second actuators.

11. A projection optical system for projecting a pattern of a mask onto a substrate, comprising:
 an optical apparatus for deforming a reflecting surface of a mirror, comprising:
 a base plate;
 a plurality of first actuators each having a first terminal connected to a surface opposite to the reflecting surface of the mirror and a second terminal connected to the base plate, and configured to apply a force to the surface opposite to the reflecting surface by deforming so as to change a distance between the first terminal and the second terminal;
 a plurality of second actuators each having rigidity lower than that of the first actuators, arranged between the mirror and the base plate, and configured to apply a force to the surface opposite to the reflecting surface;
 a sensor configured to detect information indicating a driving status of each of the plurality of first actuators; and
 a control unit configured to control, based on an output of the sensor, driving of each of the plurality of first actuators and driving of each of the plurality of second actuators so that a shape of the reflecting surface is changed to a target shape.

12. An exposure apparatus for exposing a substrate, comprising:
 a projection optical system for projecting a pattern of a mask onto a substrate, comprising:
 an optical apparatus for deforming a reflecting surface of a mirror, comprising:
 a base plate;
 a plurality of first actuators each having a first terminal connected to a surface opposite to the reflecting surface of the mirror and a second terminal connected to the base plate, and configured to apply a force to the surface opposite to the reflecting surface by deforming so as to change a distance between the first terminal and the second terminal;
 a plurality of second actuators each having rigidity lower than that of the first actuators, arranged between the mirror and the base plate, and configured to apply a force to the surface opposite to the reflecting surface;
 a sensor configured to detect information indicating a driving status of each of the plurality of first actuators; and
 a control unit configured to control, based on an output of the sensor, driving of each of the plurality of first actuators and driving of each of the plurality of second actuators so that a shape of the reflecting surface is changed to a target shape.

13. A method of manufacturing an article, the method comprising:
- exposing a substrate using an exposure apparatus;
- developing the exposed substrate; and
- processing the developed substrate to manufacture the article,
- wherein the exposure apparatus for exposing the substrate includes a projection optical system having an optical apparatus,
- wherein the optical apparatus for deforming a reflecting surface of a mirror includes:
  - a base plate;
  - a plurality of first actuators each having a first terminal connected to a surface opposite to the reflecting surface of the mirror and a second terminal connected to the base plate, and configured to apply a force to the surface opposite to the reflecting surface by deforming so as to change a distance between the first terminal and the second terminal;
  - a plurality of second actuators each having rigidity lower than that of the first actuators, arranged between the mirror and the base plate, and configured to apply a force to the surface opposite to the reflecting surface;
  - a sensor configured to detect information indicating a driving status of each of the plurality of first actuators; and
  - a control unit configured to control, based on an output of the sensor, driving of each of the plurality of first actuators and driving of each of the plurality of second actuators so that a shape of the reflecting surface is changed to a target shape.

* * * * *